United States Patent
Bach

(10) Patent No.: US 8,027,131 B2
(45) Date of Patent: Sep. 27, 2011

(54) METHOD AND CIRCUIT ARRANGEMENT FOR PROTECTION AGAINST ELECTROSTATIC DISCHARGES

(75) Inventor: Elmar Bach, Villach (AT)

(73) Assignee: Infineon Technologies AG, Neubiberg (DE)

( * ) Notice: Subject to any disclaimer, the term of this patent is extended or adjusted under 35 U.S.C. 154(b) by 276 days.

(21) Appl. No.: 12/164,395

(22) Filed: Jun. 30, 2008

(65) Prior Publication Data

US 2009/0323234 A1 Dec. 31, 2009

(51) Int. Cl.
*H02H 3/22* (2006.01)
(52) U.S. Cl. .......................... 361/56; 361/111
(58) Field of Classification Search .............. 361/56, 361/111
See application file for complete search history.

(56) References Cited

U.S. PATENT DOCUMENTS

| | | | |
|---|---|---|---|
| 5,637,900 A * | 6/1997 | Ker et al. ................... 257/355 |
| 5,917,689 A * | 6/1999 | English et al. ................ 361/56 |
| 6,011,420 A * | 1/2000 | Watt et al. ................... 327/310 |
| 6,125,021 A * | 9/2000 | Duvvury et al. .............. 361/56 |
| 6,128,173 A * | 10/2000 | Iwasaki ...................... 361/111 |
| 6,580,184 B2 * | 6/2003 | Song .......................... 307/112 |
| 6,999,292 B2 * | 2/2006 | Clara et al. .................. 361/91.1 |
| 2002/0163768 A1 * | 11/2002 | Kwon et al. ................. 361/56 |

* cited by examiner

*Primary Examiner* — Danny Nguyen
(74) *Attorney, Agent, or Firm* — Dickstein Shapiro LLP

(57) ABSTRACT

An electronic circuit device is provided which comprises an electronic circuit unit, an ESD protection unit connected in parallel to the electronic circuit unit and configured to clamp a supply voltage of the electronic circuit unit, at least one input clamp unit configured to clamp input voltages applied at at least one input terminal of the electronic circuit unit, and at least one ESD clamp provided at the at least one input terminal and configured to protect the electronic circuit unit against electrostatic discharges.

25 Claims, 12 Drawing Sheets

METHOD AND CIRCUIT ARRANGEMENT FOR PROTECTION AGAINST ELECTROSTATIC DISCHARGES

BACKGROUND

The present invention generally relates to a protection of an electronic circuit against electrostatic discharges (ESD), and especially relates to a protection device for mixed voltage circuits.

In applications like hard-disk drive read channel units that require maximum speed of an analog processing chain it is advantageous to make use of the fast devices that are available in CMOS technology. These devices are operated in the digital domain and are formed with thin oxides. The operating conditions are limited to specified maximum voltages, especially with respect to the gate-source connection, the gate-drain connection and the drain-source connection.

Thus the supply voltage for thin oxide circuit units is low such that deep sub-micron processes can be applied. Analog front end circuits operating at extreme low supply voltages suffer from the loss of headroom available for biasing these devices. Due to this fact and due to the low drain-source impedance of the core devices the required transistor dimensions increase to allow a biasing of e.g. a current source at a low drain-source voltage operating point. With the increase of transistor size parasitic capacitances also increase which results in parasitic poles that can dominate the signal path. Therefore it is necessary to use higher supply voltages in the signal path in order to obtain an optimum headroom of the devices resulting in smaller device sizes. An appropriate biasing of the thin-oxide circuit units (core devices) ensures that these devices are not damaged. This results in a so-called mixed-voltage circuit unit.

SUMMARY

In view of the above the present invention provides a circuit arrangement including circuit units which require different supply voltages. Specifically the present invention provides a protection device for a mixed voltage circuit device including a thin oxide circuit unit and a thick oxide circuit unit. The thin oxide circuit unit is operated at a supply voltage which is lower than the supply voltage of the thick oxide circuit unit.

According to a first aspect of the present invention an electronic circuit device is provided which includes an electronic circuit unit, an ESD protection unit connected in parallel to the electronic circuit unit and configured to clamp a supply voltage of the electronic circuit unit, at least one input clamp unit configured to clamp input voltages applied at at least one input terminal of the electronic circuit unit, and at least one ESD clamp provided at the at least one input terminal and configured to protect the electronic circuit unit against electrostatic discharges.

According to a further aspect of the present invention a mixed voltage circuit device is provided which includes a thin oxide circuit unit configured to be operated at a first supply voltage, a thick oxide circuit unit configured to be operated at a second supply voltage larger than the first supply voltage, an intermediate node connecting the thin oxide circuit unit and the thick oxide circuit unit in series, and an ESD protection unit connected to the intermediate node in parallel to the thin oxide circuit unit and configured to clamp the first supply voltage.

Furthermore the present invention provides a method for protecting an electronic circuit device including an electronic circuit unit, the method including clamping a supply voltage of the electronic circuit unit using an ESD protection unit connected in parallel to the electronic circuit unit, clamping input voltages applied at at least one input terminal of the electronic circuit unit using at least one input clamp unit, and protecting the electronic circuit unit is protected against electrostatic discharges using at least one ESD clamp provided at the at least one input terminal.

Furthermore the present invention provides a method for protecting a mixed voltage circuit device including a thin oxide circuit unit configured to be operated at a first supply voltage, a thick oxide circuit unit configured to be operated at a second supply voltage which is larger than the first supply voltage, and an intermediate node connecting the thin oxide circuit unit and the thick oxide circuit unit in series, the method including clamping the first supply voltage using an ESD protection unit connected to the intermediate node in parallel to the thin oxide circuit unit.

DRAWINGS

Embodiments of the present invention are depicted in the drawings and are detailed in the description which follows.

Figure 5:
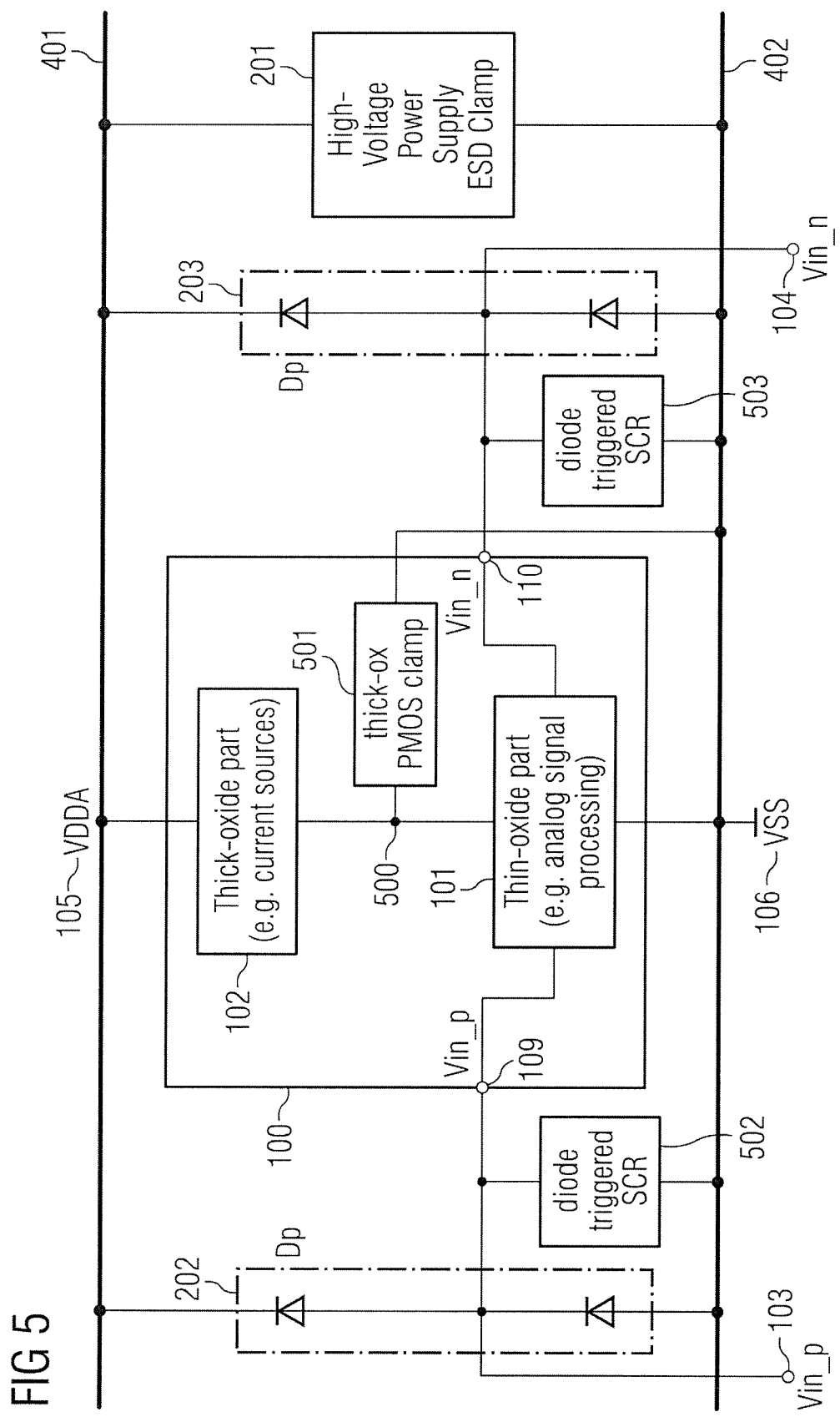
Figure 10:
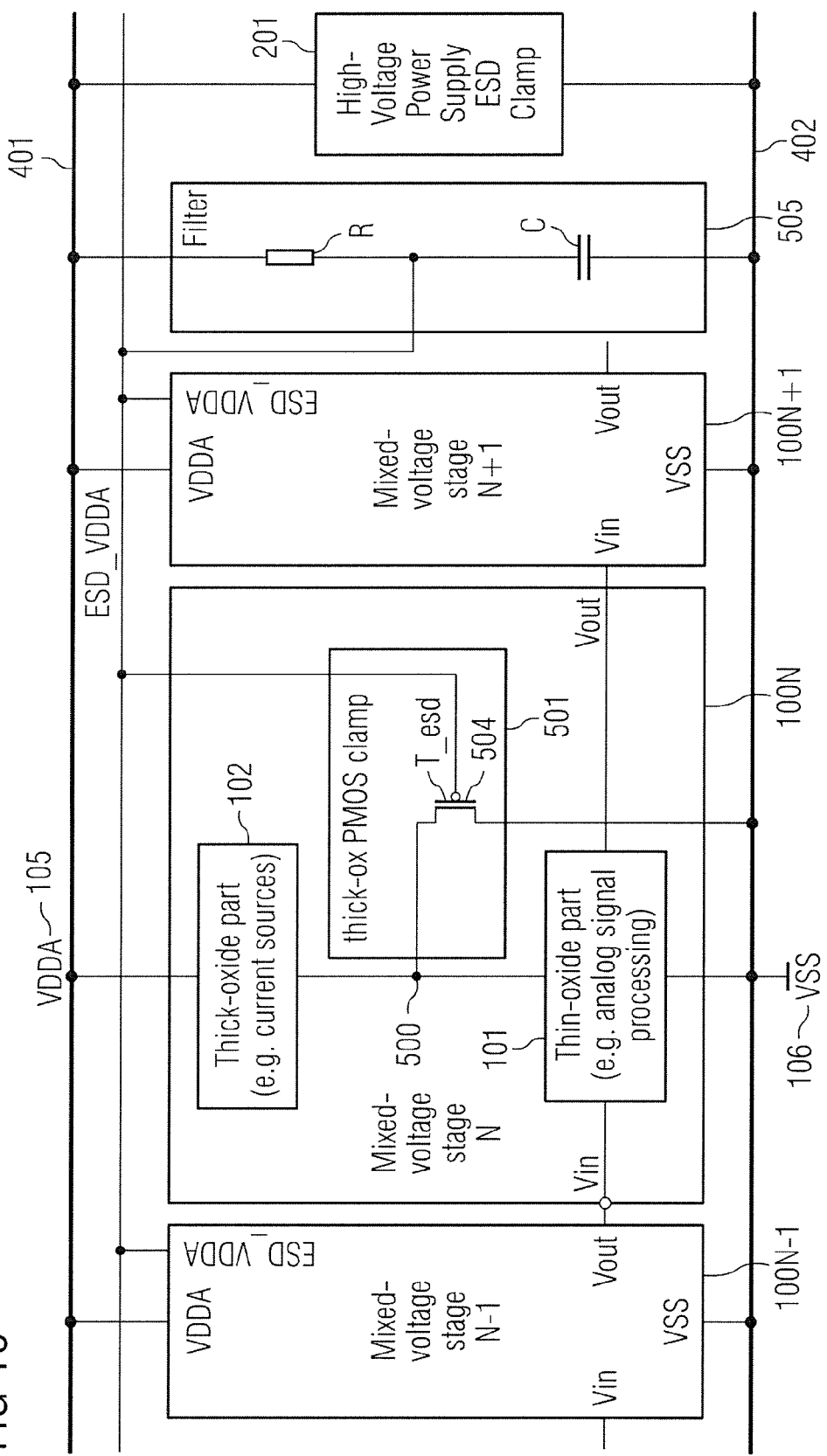
Figure 11:
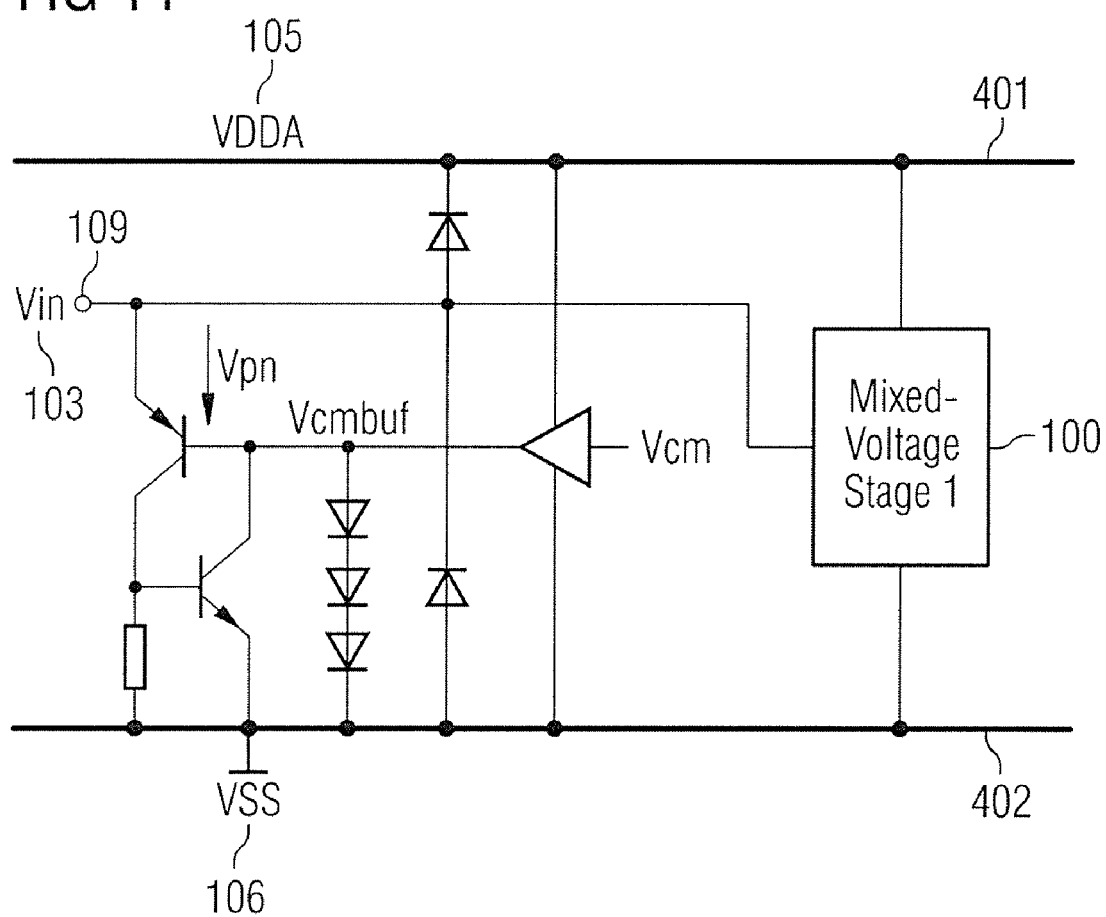
Figure 12:
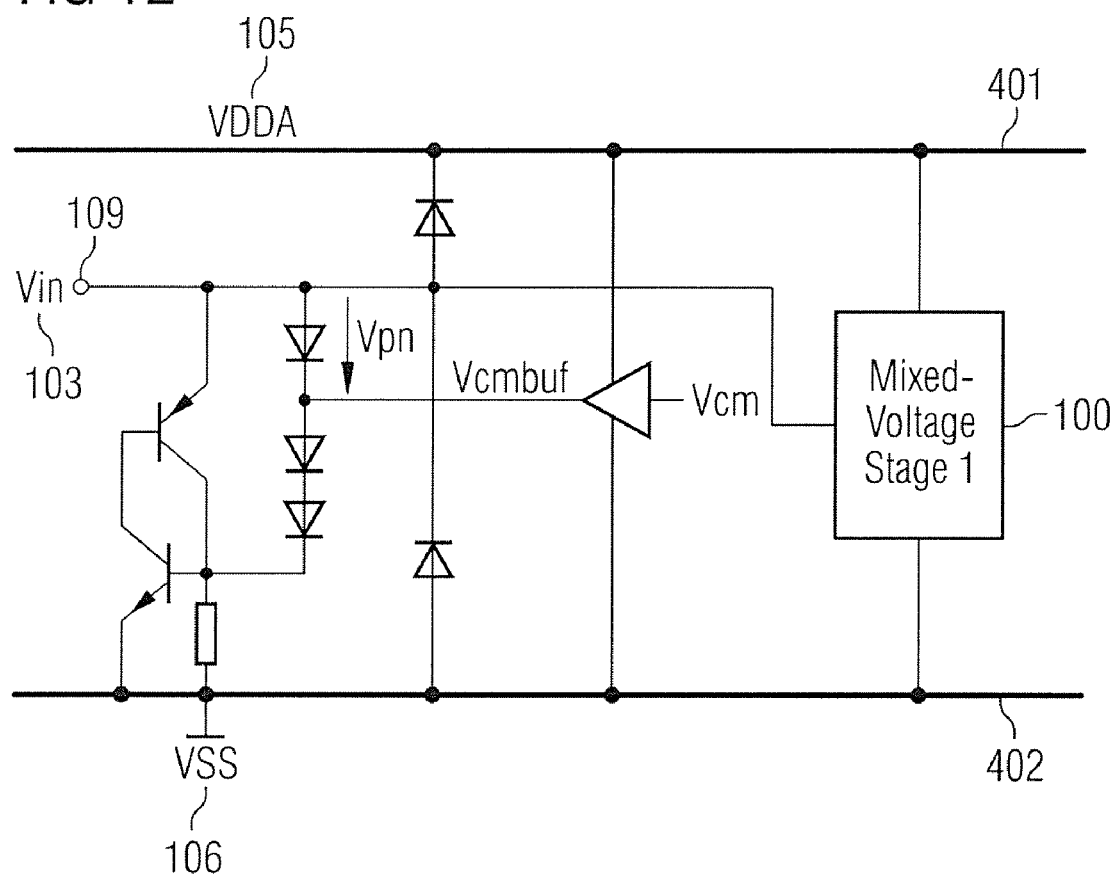

FIGS. 4(a)-4(e) exhibit different types of power supply ESD (electrostatic discharge) clamps;

FIG. 5 shows a mixed signal circuit device having a thick oxide circuit unit and a thin oxide circuit unit, wherein an ESD protection means and positive and negative ESD clamps are provided for the protection the thin oxide circuit unit;

FIGS. 6, 7, 8 and 9 illustrate discharge paths for the circuit arrangement shown in FIG. 5, wherein a negative input terminal is loaded with a discharge being positive against VSS (FIG. 6), positive against VDDA (FIG. 7), negative against VSS (FIG. 8) and negative against VDDA (FIG. 9), respectively;

FIG. 10 is a circuit block diagram showing a gate-triggered PMOS ESD clamp unit in a mixed voltage circuit device cascaded with N other mixed voltage circuits and a common filter unit;

FIG. 11 shows a circuit diagram of an ultra-low leakage ESD clamp having a n-tap structure for single ended interfaces; and FIG. 12 shows an ultra-low leakage p-tap protection structure for single ended interfaces.

In the figures, same reference numerals denote the same or similar parts.

DETAILED DESCRIPTION

Reference will now be made in detail to the various exemplary embodiments of the present invention, one or more examples of which are illustrated in the figures. Each example is provided by way of explanation of the invention and is not meant as a limitation of the present invention. For example, features illustrated or described as part of one embodiment can be used on or in conjunction with other embodiments to yield yet a further embodiment. It is intended that the present invention includes such modifications and variations.

A number of embodiments will be explained below. In this case, identical structural features are identified by identical reference symbols in the figures. The structures shown in the figures are not depicted true to scale but rather serve only for the better understanding of the embodiments.

Figure 1:
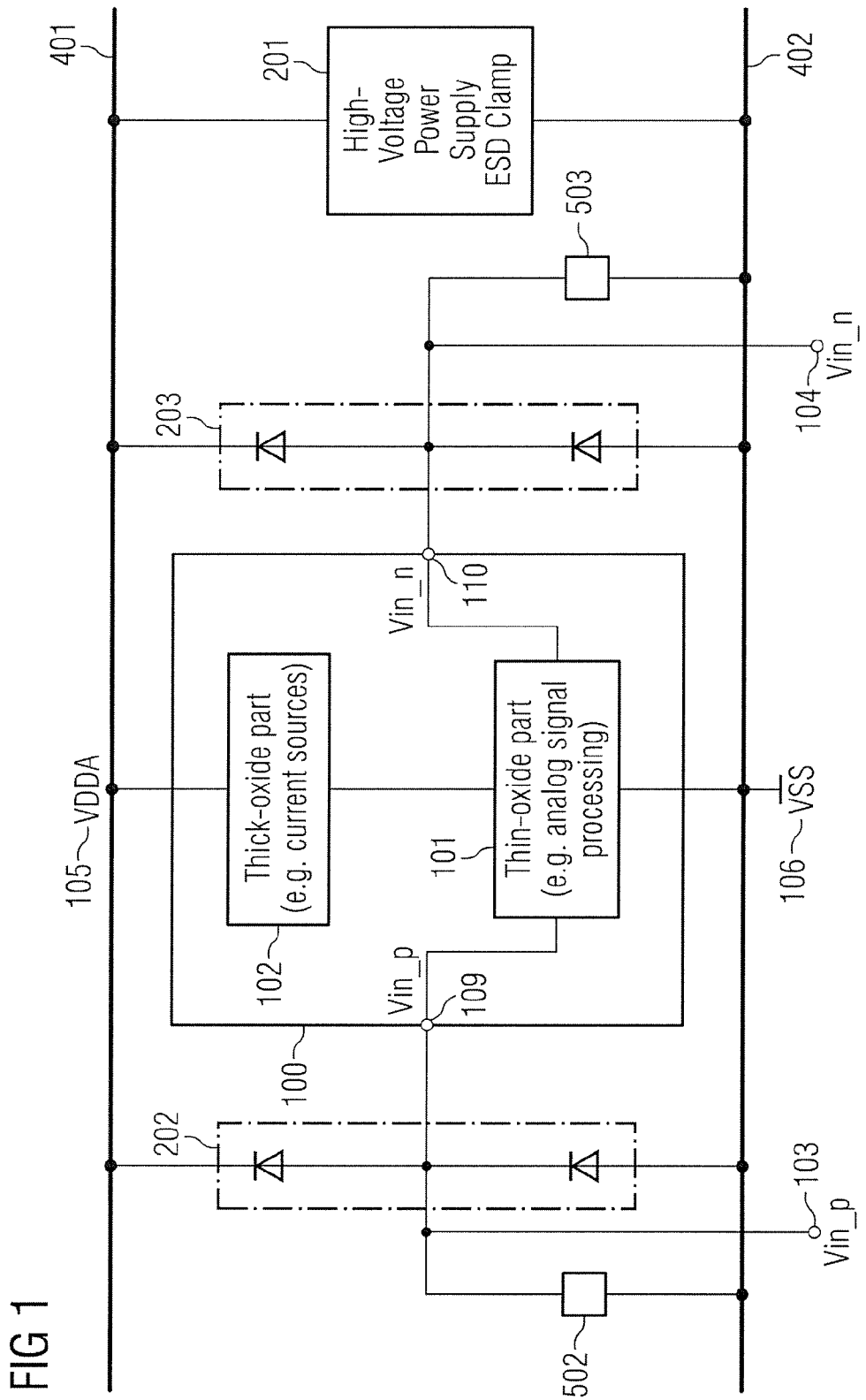
FIG. 1 is a block diagram illustrating a mixed voltage circuit device connected between first and second power supply lines and including input diode clamps and ESD clamps at input terminals.

FIG. 1 is a block diagram of a circuit arrangement including a mixed voltage circuit device 100 which consists of a thin oxide circuit unit 101 and a thick oxide circuit unit 102. The thin oxide circuit unit 101 and the thick oxide circuit unit 102 are connected in series between the first power supply line 401 and the second power supply line 402 (between VDDA (supply voltage 105) and VSS (ground potential 106)), wherein the supply voltage VDDA 105 exceeds the maximum tolerated voltage of a thin-oxide device.

The thin oxide circuit unit 101 is a differential circuit unit including two input terminals, i.e. a positive input terminal 109 and a negative input terminal 110. Both input terminals are protected against ESD discharges by a diode stack, i.e. by a positive input diode clamp 202 at the positive input terminal 109 and a negative input diode clamp 203 at the negative input terminal 110.

The entire circuit unit is connected between a first power supply line 401 providing a supply voltage 105 (VDDA) and a second power supply line 402 providing ground potential 106 (VSS). As illustrated in FIG. 1 the circuit arrangement furthermore includes a positive input diode clamp 202 connected at the positive input terminal 109 and a negative input diode clamp 203 connected at the negative input terminal 110. These input clamps 202, 203 protect the sensitive inputs of the thin oxide circuit unit 102 from over-and undervoltage that might occur during electrostatic discharges.

As shown in FIG. 1, in addition to the positive input diode clamp 202 a positive ESD clamp 502 is provided at the positive input terminal 109, wherein in addition to the negative input diode clamp 203 a negative ESD clamp 503 is provided at the negative input terminal 110.

Stress from electrostatic discharges (ESD) is a major issue in the design of mixed voltage circuit devices having thin oxide circuit units. For differential interfaces five ESD categories of discharge events can be defined:

(i) pin positive against VSS (ground potential);
(ii) pin positive against VDDA (supply voltage);
(iii) pin negative against VSS;
(iv) pin negative against VDDA; and
(v) pin-to-pin stress at a differential interface, i.e. Vin_p positive against Vin_n and vice-versa.

The above mentioned ESD category (v) does not apply to single-ended interfaces. Besides these ESD scenarios core circuits have to be protected against electrostatic discharges which occur between the supply lines 401 and 402, i.e. VDDA positive against VSS and VSS positive against VDDA. Advantageously an ESD protection design includes the protection of sensitive thin oxide devices under all scenarios (i) to (v) mentioned above. Furthermore it is necessary that the ESD structure that connects to the (input) pin (input terminal) exhibits minimum leakage.

Figure 2:
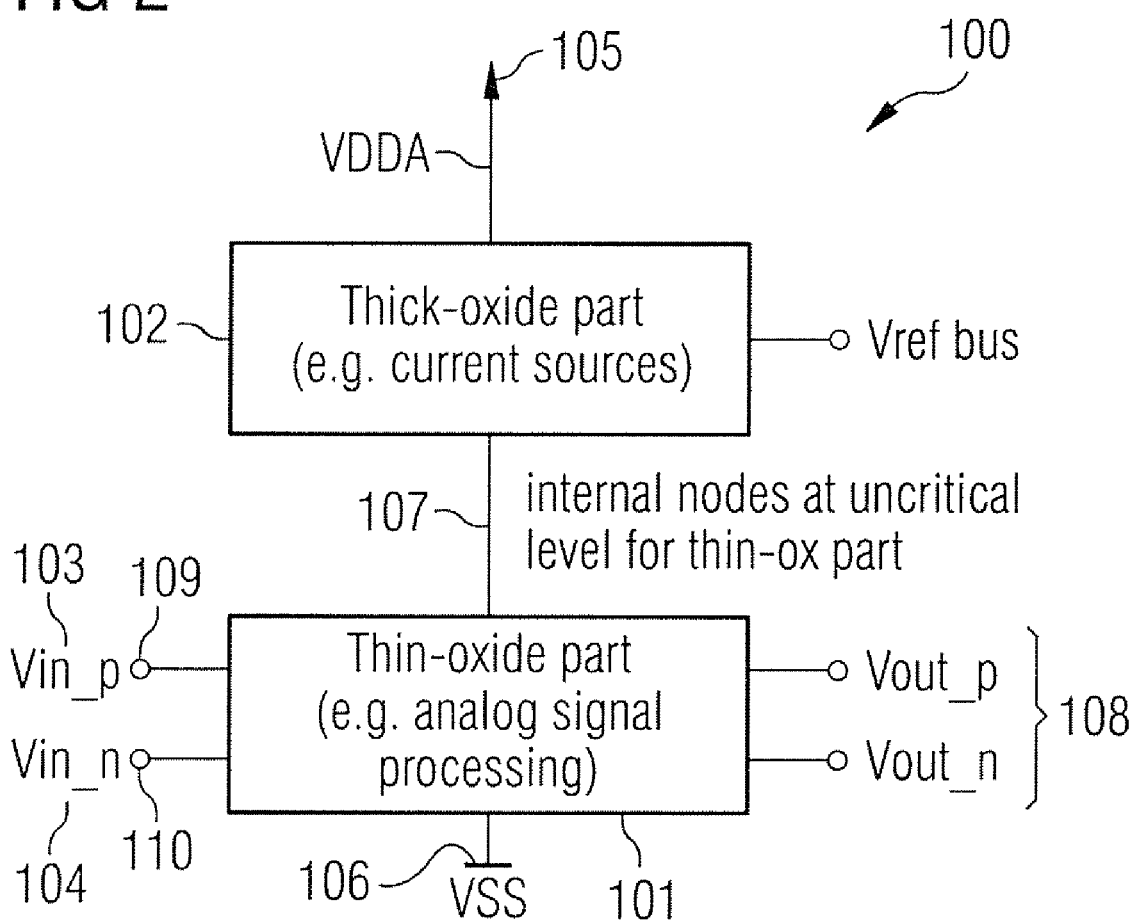
FIG. 2 shows a circuit configuration of the mixed-voltage circuit unit illustrated in FIG. 1, wherein the mixed-voltage circuit unit includes a thin oxide circuit unit (core device) and a thick oxide circuit unit.

FIG. 2 shows a circuit configuration of the mixed-voltage circuit device 100 illustrated in FIG. 1, wherein the mixed-voltage circuit unit includes a thin oxide circuit unit (core device) and a thick oxide circuit unit. The basic block diagram of FIG. 2 shows a mixed voltage circuit device 100 including a thin oxide circuit unit 101 and a thick oxide circuit unit 102. The thin oxide circuit unit 101 and the thick oxide circuit unit 102 are connected in series between a supply voltage connection 105 and the ground potential 106.

The thin oxide circuit unit consists of a differential input, i.e. a positive input terminal 109 and a negative input terminal 110 and a differential output providing a differential output voltage 108. The mixed voltage circuit device 100 shown in FIG. 2 furthermore includes an internal node 107 at an uncritical level, i.e. an uncritical potential with respect to the thin oxide circuit unit 101.

The thick oxide circuit unit 102 can operate at a higher supply voltage than the thin oxide circuit unit 101 such that the thick oxide circuit unit 102 can be used to protect the thin oxide circuit unit against voltage stress under normal operation and in a power down state. A part of the thick oxide circuit unit can be e.g. current sources driven by a reference voltage bus Vref_bus. The thick oxide circuit unit 102 performs an analog signal processing with respect to the differential input voltage 103, 104 provided at the input terminals 109, 110 (Vin_t, Vin_n). After the signal processing an analog output voltage 108 (Vout_p, Vout_n) is derived. It is noted here that the signal processing in the current domain can be performed as well. In this case the input and output signals are currents.

It is thus possible to choose a voltage level at the internal nodes in such a manner that an optimum biasing condition of the core devices (thin oxide circuit units 101) is obtained. Therefore device sizes can be reduced which leads to lower parasitic capacitances. Thus an improvement is achieved by increasing the parasitic pole frequencies allowing an operation at a higher bandwidth.

As an illustrative example, the voltage VDDA with respect to the ground potential 106 can be as high as 3.3 V to 3.5 V and the voltage potential at the internal node 107 with respect to the ground potential 106 can be as high as 1.8 V.

Figure 3:
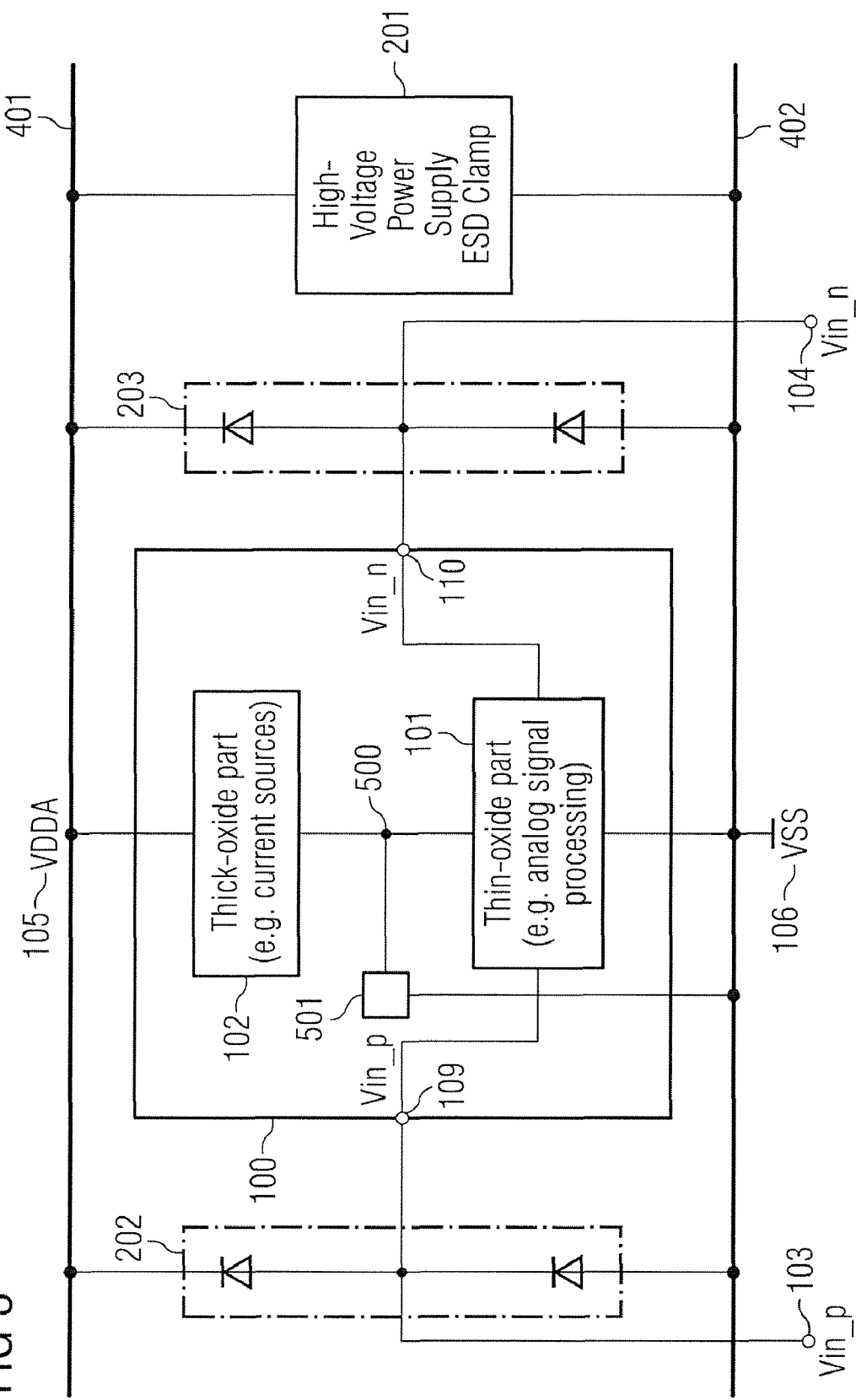
FIG. 3 is a block diagram illustrating a mixed voltage circuit device connected between first and second power supply lines and including a ESD protection device connected between an intermediate node and ground.

FIG. 3 is a block diagram illustrating a mixed voltage circuit device connected between first and second power supply lines and including an ESD protection device connected between an intermediate node and ground. In order to protect the thin oxide circuit unit against electrostatic discharges, an ESD protection means 501 is provided.

The ESD protection means 501 is connected between an intermediate node 500 (corresponding to the internal node 107 shown in FIG. 2) and ground 106 (VSS). Thus the thin oxide circuit unit 101 is connected in parallel to the ESD protection means 501. The ESD protection means 501 protects the thin oxide circuit unit 101 against ESD stress (electrostatic discharges).

Figure 4:
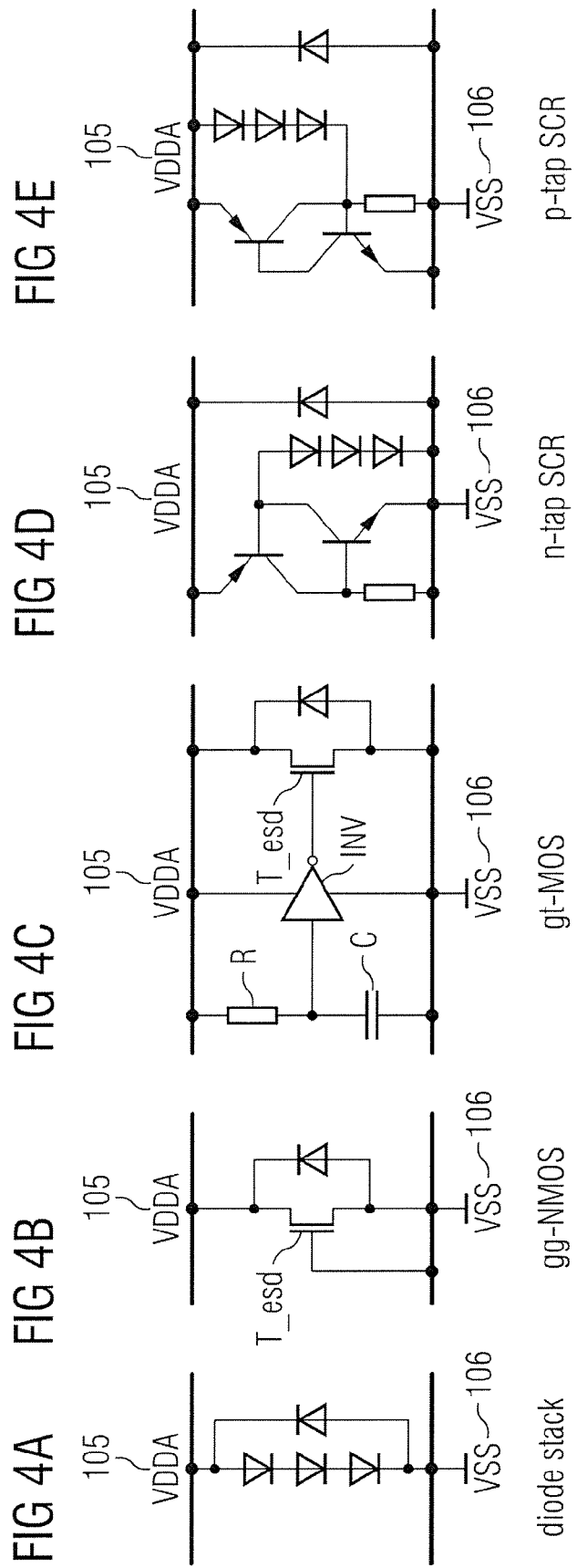

In FIG. 4 several ESD clamps are illustrated as an example. These clamps can be used as power supply clamps 201 in FIG. 1. FIG. 4(a) shows an ESD clamp which consists of four diodes, wherein three diodes are connected in series between VDDA and VSS. Such kind of a "diode stack" ESD clamp unit has a leakage path from VDDA to VSS under normal operating conditions which is not allowable for specific applications.

FIG. 4(b) exhibits a grounded-gate NMOS clamp where a so called "snap-back" effect is provided which occurs at a relatively high voltage. Even if thin oxide transistors are used the trigger voltage can still exceed the maximum allowed voltage levels of thin oxide devices. Therefore such grounded-gate NMOS clamp units are not suited for the protection of thin-oxide circuits in deep-submicron technologies, i.e. in technologies for 90 nm, 65 nm structures, etc.

In FIG. 4(c) a gate-triggered NMOS clamp is depicted. This clamp can be designed with thin oxide transistors or thick oxide transistors T_esd. In order to provide a low clamp voltage which is required for the protection of the thin oxide circuit unit 101 the transistor size of the thick oxide clamp unit is significantly larger. A total width of several millimeters is necessary. The trigger voltage is determined by the time constant RC of the components R (resistor) and C (capacitor) of the filter. A drive capability of an inverter INV controls the gate of the clamp transistor T_esd. In order to obtain a low trigger voltage the inverter INV has to drive the gate of the transistor T_esd such that the transistor is rapidly turned on.

Due to the large transistor size thin oxide devices may be required in order to obtain a maximum drive capability. When thin oxide circuit units 101 are provided in this case, the supply voltage 105 (VDDA) is limited to a specific value. In case thick oxide circuit units 102 are used, the supply voltage 105 can exceed the maximum supply voltage of core device (thin oxide circuit unit 101).

A power supply ESD clamp which is designed as a diode-triggered silicon control rectifier (SCR) is shown in FIG. 4(*d*) (n-tap SCR) and FIG. 4(*e*) (p-tap SCR). These kinds of silicon controlled rectifier circuit units (SCR circuits) provide a low trigger voltage determined by the number of diodes that are used in the trigger branch. This number can be optimized on the basis of an allowable leakage current. The clamp voltage is low and the whole circuit unit of the SCR circuits is very area-efficient. Typically, a trigger voltage of 3.5 V is required for a 90 nm process and even lower for a 65 nm CMOS-process. Thus it is not possible to use this kind of SCR circuits at an operating voltage of 3.3 V.

In order to take advantage of a mixed voltage approach the supply voltage VDDA of a mixed voltage circuit device 100 is significantly higher than the maximum allowed supply voltage for a current device (a thin oxide circuit unit 101).

In order to further increase the protection performance the ESD protection means 501 is provided in addition to the positive and negative ESD clamps, as shown in FIG. 5. FIG. 5 is a block diagram illustrating an exemplary embodiment of an ESD protection device.

The ESD protection means 501 is connected between an intermediate node 500 and ground 106 (VSS). Thus the thin oxide circuit unit 101 is connected in parallel to the ESD protection means 501. The ESD protection means 501 protects the thin oxide circuit unit 101 against ESD stress. As shown in FIG. 5, in addition to the ESD protection means 501 two ESD clamps 502, 503 are provided.

At the positive input terminal 109 the positive ESD clamp 502 is provided, wherein at the negative input terminal 110 the negative ESD clamp 503 is provided. These ESD clamps 502, 503 are connected in parallel to the lower diode of the positive input diode clamp 202 and the negative input diode clamp 203, respectively. Due to this configuration of the protection arrangement for the mixed voltage circuit device 100 ESD discharge scenarios occur, which are described below with respect to FIGS. 6-9.

FIGS. 6, 7, 8 and 9 show the circuit arrangement of FIG. 5, wherein the relevant discharge paths (broken lines) are depicted.

Figure 6:
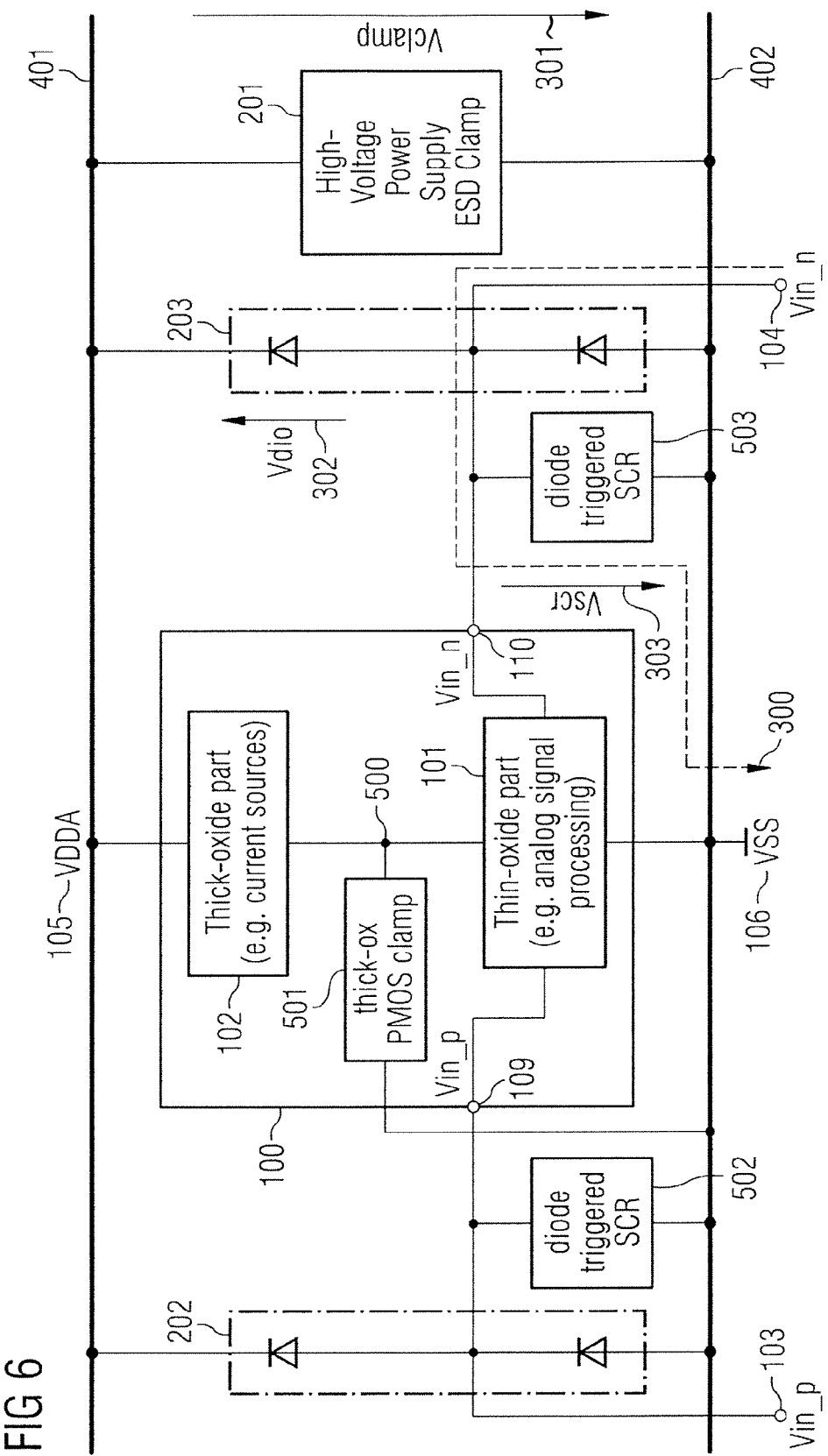

FIG. 6 illustrates a discharge path 300 in a case when the voltage at the negative input terminal 110 is positive with respect to ground potential 106 (VSS). This case, i.e. "pin positive against VSS", exhibits a discharge path which does not pass via the power supply ESD clamp unit 201. Due to the negative ESD clamp 503 the ESD stress is transformed into a SCR (silicon controlled rectifier) voltage 303 across the negative ESD clamp 503.

A parallel discharge path could open through the upper diode in 203 and ESD power clamp 201. But this discharge path will only trigger at a higher voltage due to the nature of the high-voltage ESD power clamp 201.

It is noted here that equivalent discharge paths can be provided if the positive input terminal is subjected to ESD stress. In this case the positive ESD clamp 502 provides a SCR voltage between the positive input terminal 109 and ground 106 (clamp voltage).

Figure 7:
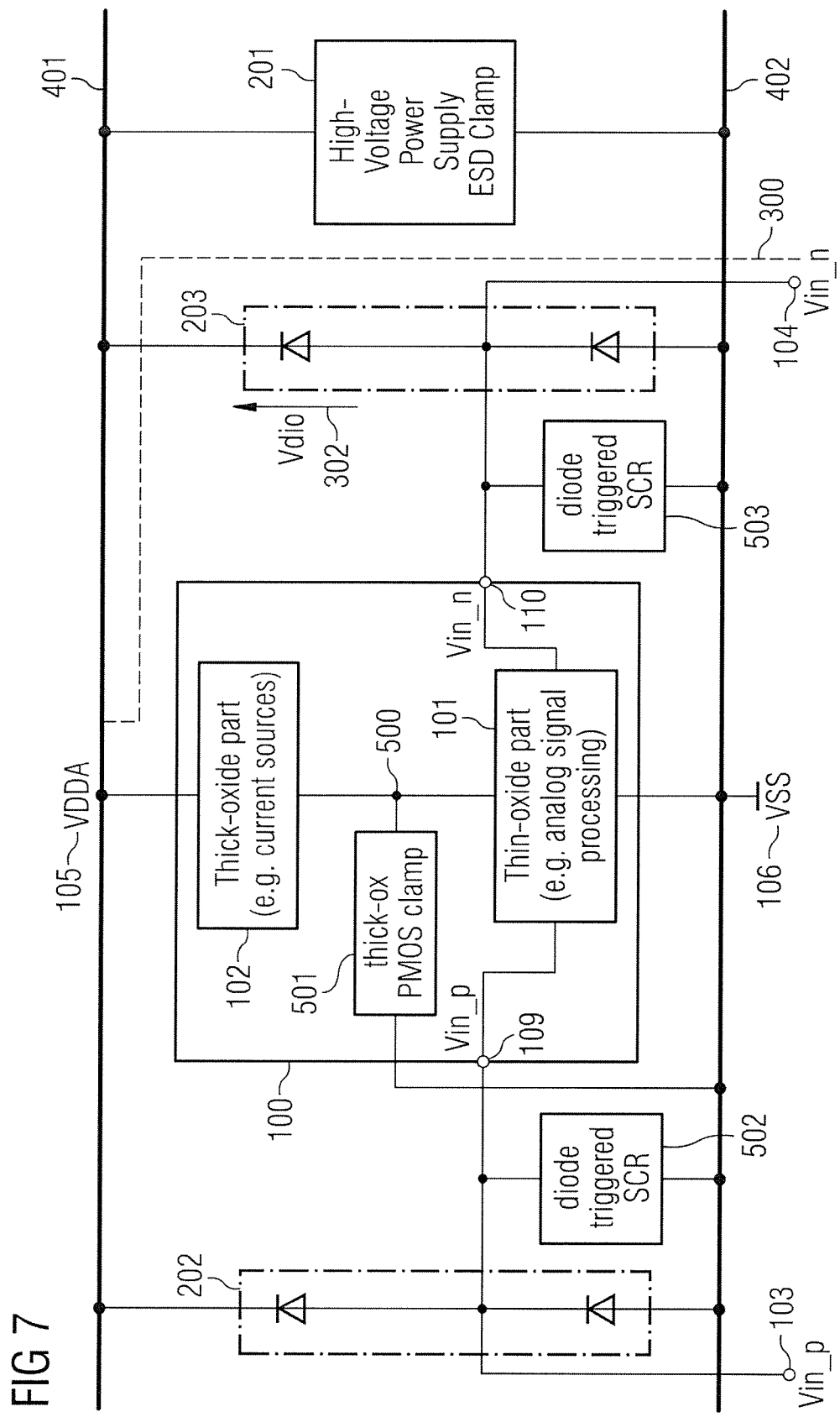
Figure 8:
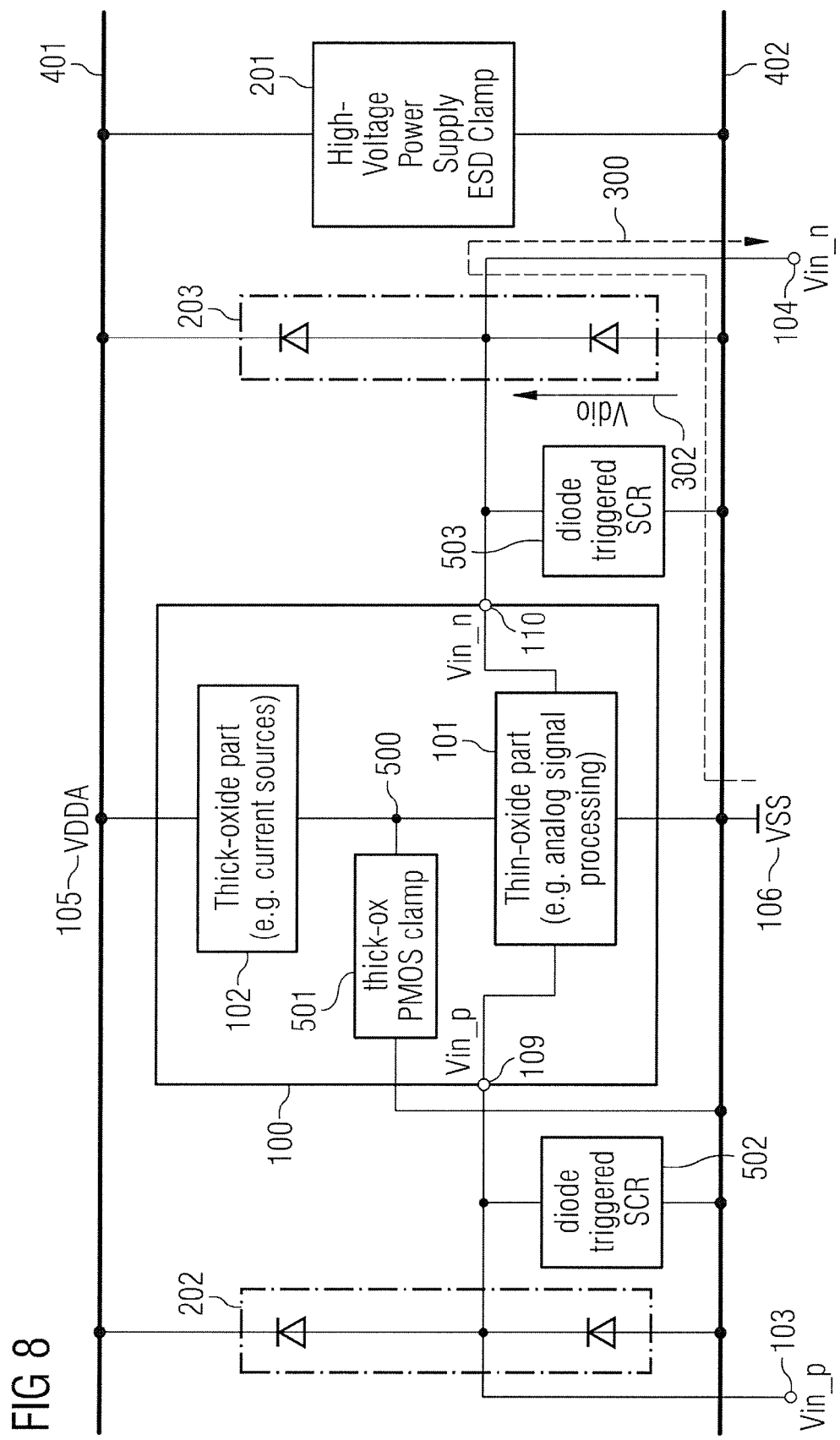
Figure 9:
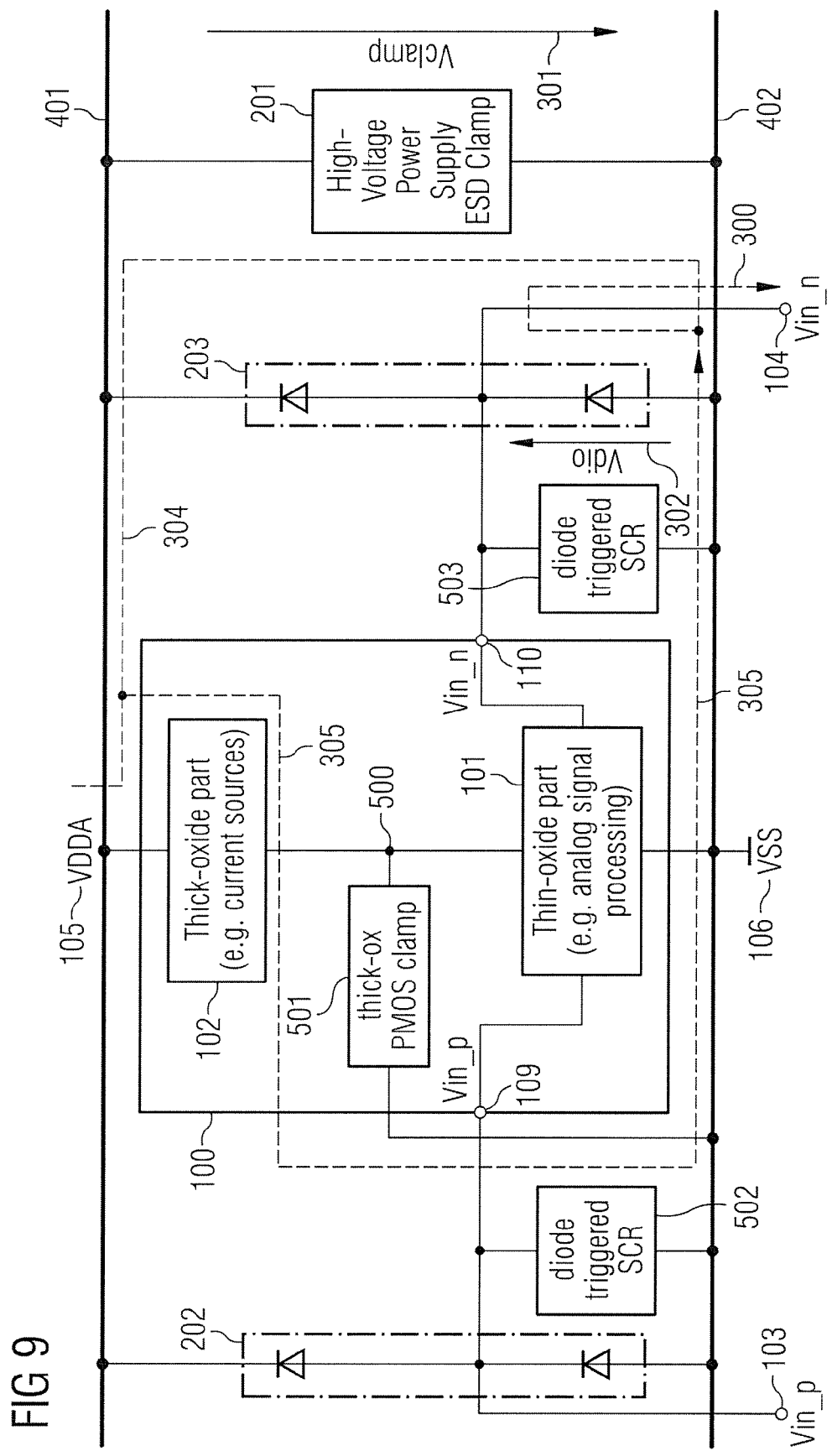

In order to avoid a redundant description parts or components, which have been already described with respect to FIG. 6, are not described with respect to FIG. 7-FIG. 9. FIGS. 6-9 illustrate a discharge path 300 (broken line) which is related to the negative input terminal 110.

It is noted that equivalent discharge paths can be obtained with respect to the positive input terminal 109 such that the present invention is not restricted to discharge paths related to the negative input terminal 110.

FIG. 7 shows the case where the negative input terminal 110 is subjected to positive voltage stress with respect to VDDA (supply voltage 105). In this case the discharge path is formed from the input node 110 (negative input terminal) directly to the first power supply line 401 (VDDA). Again, the power supply ESD clamp unit 201 is not contained in the discharge path 300.

FIG. 8 is another discharge path 300 in a case, where the input voltage at the negative input terminal 110 is negative with respect to ground potential 106 ("pin negative against VSS"). The discharge path is formed from the input node 110 (negative input terminal) via the lower diode of the negative input diode clamp 203 to ground potential 106. In this case a diode voltage drop 302 is provided across the lower diode of the negative input diode clamp 203.

In the situation shown in FIG. 9 two discharge paths are formed, i.e. a main discharge path 304 which is formed via the power supply ESD clamp unit 201 providing a clamp voltage 301, and an auxiliary discharge path 305, which is formed via the ESD protection means 501 to the first power supply line 401. The case shown in FIG. 9 represents a negative voltage (ESD) stress at the negative input terminal 110 with respect to the supply voltage 105 (VDDA).

The advantage of the circuit arrangement including the ESD protection means 501, the positive ESD clamp 502 and the negative ESD clamp 503 is that the power supply ESD clamp unit 201 is not essential for protecting the thin oxide circuit 101 of the mixed voltage circuit device 100.

Especially the cases shown in FIG. 6 and in FIG. 9 require secure voltage conditions for the circuit which is coimected to the input pins. It is a specific advantage that the power supply ESD clamp unit 201 is not part of the discharge path. Thus it is not required that the power supply clamp unit 201 provides a sufficiently small clamp voltage 301 (Vclamp) and a sufficiently low trigger voltage such that the damage of the entire circuit arrangement is avoided.

In the cases shown in FIG. 6-FIG. 9 it is not necessary to optimize the power supply ESD clamp unit 201 in dependence of the circuit arrangement (mixed voltage circuit device 100) to be protected. Thus the protection mode will depend on the transistor types. Typical thin oxide circuit units 101 require a low supply voltage 105 (VDDA) and thus require a specific ESD protection device optimized for the protection of low voltage circuits.

FIG. 10 is a block diagram of several stages of mixed voltage circuit devices 100N–1, 100N, 100N+1, wherein N denotes a stage index. In this case the mixed voltage circuit device 100 is single-ended, i.e. no differential input voltage and no differential output voltage are provided. The interior of the mixed voltage circuit device 100N is shown. The mixed voltage circuit device 100N consists of a thin oxide circuit unit 101, a thick oxide circuit unit 102 and an ESD protection means 501.

The ESD protection means 501 includes a clamp transistor 504 (T_esd) which is provided as a thick oxide PMOS clamp unit. This additional PMOS transistor is provided at all intermediate nodes 500 between the thick oxide circuit units 102 and the thin oxide circuit units 101 of the mixed voltage circuit devices 100N−1, 100N, 100N+1, . . . . The auxiliary discharge path 305, which has been described with respect to FIG. 9, is provided for each mixed voltage circuit device 100N−1, 100N, 100N+1. At the intermediate node 500 the clamp voltage Vclamp between the supply voltage VDDA and the ground potential VSS is reduced to a level that is not critical for the thin oxide circuit unit 101 of the mixed voltage circuit device 100.

The ESD protection means 501 includes a PMOS thick oxide transistor T_esd. The gate of this PMOS thick oxide transistor is capacitively coupled to VSS through a capacitance C which is charged via a resistance R of a filter unit 505 (shown on the right side of FIG. 10). In normal operation conditions the PMOS thick oxide transistor T_esd is turned off. The transistor is turned on, if during an ESD stress, which raises VDDA, the internal node voltage increases because the gate is coupled to VSS. The time constant of the filter is adjusted such that it is adapted to maintain a low gate voltage if an ESD stress raises the power supply voltage VDDA to the clamp voltage level.

The design of the PMOS thick-oxide transistor T_esd depends on the design of the pull-up network incorporated in the thick oxide circuit unit 102 of the mixed voltage circuit device 100. E.g., using a thick oxide circuit unit 102 including a PMOS current source, the PMOS clamp unit (the ESD protection means 501) can be made relatively small because the current source stays in off-state due to the large gate capacitance coupling it to VDDA.

FIGS. 11 and 12 show ultra low leakage silicon controlled rectifier circuits (SCR circuits) for a single-ended interface. In FIG. 11 an n-tap SCR according to FIG. 4(d) is combined with the mixed voltage circuit device 100, wherein in FIG. 12 a p-tap SCR is combined with the mixed voltage circuit device 100, respectively. A major issue arising from the additional silicon controlled rectifier (i.e. the positive or negative ESD clamps 502 and 503, respectively) is leakage through the diode trigger path of these clamp units. The leakage can be avoided, if under normal operation conditions, the voltage Vpn across the first pn-junction is forced to be zero.

Furthermore the number of trigger diodes can be adjusted according to the requirements determined by the design of the input stage of the mixed voltage circuit device 100. It is possible to use the silicon controlled rectifier clamp unit at higher common-mode voltages, e.g. 1.6 V.

By using the ESD protection means 501, the positive ESD clamp 502 and the negative ESD clamp 503 a thin oxide circuit unit 101 of a mixed voltage circuit device 100 is protected in secure way. The ESD protection means 501 can be comnected to each node interconnecting the thick oxide circuit unit 102 and the thin oxide circuit unit 101 of the mixed voltage circuit device 100. The ESD protection means 501 may be controlled by a single RC filter unit by means of an internal control signal. Thin oxide cascode devices can be used to shield the parasitic capacitance of the PMOS clamps from the signal paths. These cascode devices can be protected in a similar manner.

The mixed voltage circuit device 100 having the ESD protection means 501 and the positive and negative ESD clamps 502, 503 at the respective positive and negative input terminals 109 and 110 is especially suited for high-speed circuits due to the increased headroom that is obtained by a mixed-voltage circuit device 100. An application example is the signal path of a hard-disk drive read channel unit including an input differential interface. This interface has to provide a resistive termination to an AC coupled interface.

A further application example is the use in low-noise low-power circuits that can be designed in a mixed-voltage arrangement by making use of stacked thin-oxide circuit units 101 leading to reduced total current requirements and to a reduction of the power consumption.

The invention has been described on the basis of embodiments which are shown in the appended figures and from which further advantages and modifications emerge. However, the invention is not restricted to the embodiments described in concrete terms, but rather can be modified and varied in a suitable manner. It lies within the scope of the invention to combine individual features and combinations of features of one embodiment with features and combinations of features of another embodiment in a suitable manner in order to arrive at further embodiments according to the invention.

It will be obvious to those skilled in the art, based upon the teachings herein, that changes and modifications may be made without departing from the invention disclosed and its broader aspects. That is, all examples set forth herein above are intended to be exemplary and non-limiting.

The invention claimed is:

1. An electronic circuit device, comprising
    a) an electronic circuit unit;
    b) an ESD protection unit connected in parallel to the electronic circuit unit and configured to clamp a supply voltage of the electronic circuit unit;
    c) at least one input clamp unit configured to clamp input voltages applied at at least one input terminal of the electronic circuit unit; and
    d) at least one ESD clamp provided at the at least one input terminal and configured to protect the electronic circuit unit against electrostatic discharges.

2. The circuit device in accordance with claim 1, wherein the ESD protection unit is configured to clamp the supply voltage between an intermediate node of the circuit device and ground.

3. The circuit device in accordance with claim 2, wherein the ESD protection unit comprises a PMOS thick-oxide transistor.

4. The circuit device in accordance with claim 1, wherein the at least one ESD clamp is formed as a silicon controlled rectifier circuit, wherein the silicon controlled rectifier circuit is one of an n-tap type and a p-tap type circuit.

5. The circuit device in accordance with claim 1, wherein the at least one ESD clamp is formed as a gate-triggered clamp unit.

6. The circuit device in accordance with claim 1, wherein the at least one ESD clamp is formed as a diode stack.

7. The circuit device in accordance with claim 1, wherein the at least one ESD clamp is formed as a grounded gate clamp.

8. A mixed voltage circuit device, comprising
    a) a thin oxide circuit unit configured to be operated at a first supply voltage;
    b) a thick oxide circuit unit configured to be operated at a second supply voltage larger than the first supply voltage;
    c) an intermediate node connecting the thin oxide circuit unit and the thick oxide circuit unit in series; and d) an ESD protection unit connected to the intermediate node in parallel to the thin oxide circuit unit and configured to clamp the first supply voltage.

9. The circuit device in accordance with claim 8, wherein the ESD protection unit is configured to clamp a supply voltage between the intermediate node of the mixed voltage circuit device and ground.

10. The circuit device in accordance with claim 9, wherein the ESD protection unit comprises a PMOS thick-oxide transistor.

11. The circuit device in accordance with claim 8, wherein a positive ESD clamp is provided at a positive input terminal of the thin oxide circuit unit and is configured to clamp a positive input voltage.

12. The circuit device in accordance with claim 8, wherein a negative ESD clamp is provided at a negative input terminal of the thin oxide circuit unit and is configured to clamp a negative input voltage.

13. The circuit device in accordance with claim 11, wherein the ESD clamp is formed as a silicon controlled rectifier circuit.

14. The circuit device in accordance with claim 13, wherein the silicon controlled rectifier circuit is one of a n-tap type and a p-tap type circuit.

15. The circuit device in accordance with claim 8, wherein the thin oxide circuit unit and the thick oxide circuit unit are formed as an integrated circuit package.

16. The circuit device in accordance with claim 8, wherein the thin oxide circuit is adapted to perform analogue signal processing.

17. A method for protecting an electronic circuit device comprising an electronic circuit unit, the method comprising:
    clamping a supply voltage of the electronic circuit unit using an ESD protection unit connected in parallel to the electronic circuit unit;
    clamping input voltages applied at at least one input terminal of the electronic circuit unit using at least one input clamp unit; and
    protecting the electronic circuit unit against electrostatic discharges using at least one ESD clamp provided at the at least one input terminal.

18. The method in accordance with claim 17, wherein the ESD protection unit comprises a PMOS thick-oxide transistor.

19. The method in accordance with claim 17, wherein the at least one ESD clamp is a positive ESD clamp provided at a positive input terminal of the thin oxide circuit unit and is configured to clamp a positive input voltage.

20. The method device in accordance with claim 17, wherein the at least one ESD clamp is a negative ESD clamp provided at a negative input terminal of the thin oxide circuit unit and is configured to clamp a negative input voltage.

21. A method for protecting a mixed voltage circuit device comprising a thin oxide circuit unit configured to be operated at a first supply voltage, a thick oxide circuit unit configured to be operated at a second supply voltage which is larger than the first supply voltage, and an intermediate node connecting the thin oxide circuit unit and the thick oxide circuit unit in series, the method comprising clamping the first supply voltage using an ESD protection unit connected to the intermediate node in parallel to the thin oxide circuit unit.

22. The method in accordance with claim 21, further comprising clamping at least one input voltage applied at an input terminal of the thin oxide circuit unit using an ESD clamp.

23. The method in accordance with claim 21, wherein in power-down mode the supply voltage is dropped across the thick oxide circuit unit.

24. The method in accordance with claim 21, wherein the thick oxide circuit unit is operated at a supply voltage which exceeds the maximum rated supply voltage for the thin oxide circuit unit.

25. The method in accordance with claim 21, further comprising biasing the thin oxide circuit unit using an intermediate node.

* * * * *